(12) United States Patent
Meisenzahl

(10) Patent No.: US 7,790,496 B2
(45) Date of Patent: Sep. 7, 2010

(54) METHOD OF IMPROVING SOLID-STATE IMAGE SENSOR SENSITIVITY

(75) Inventor: Eric J. Meisenzahl, Ontario, NY (US)

(73) Assignee: Eastman Kodak Company, Rochester, NY (US)

( * ) Notice: Subject to any disclaimer, the term of this patent is extended or adjusted under 35 U.S.C. 154(b) by 67 days.

(21) Appl. No.: 12/235,737

(22) Filed: Sep. 23, 2008

(65) Prior Publication Data

US 2009/0020788 A1 Jan. 22, 2009

Related U.S. Application Data

(62) Division of application No. 11/449,277, filed on Jun. 8, 2006, now abandoned.

(51) Int. Cl.
*H01L 21/00* (2006.01)
(52) U.S. Cl. ............... 438/73; 438/75; 438/78
(58) Field of Classification Search .......... 438/59, 438/60, 66, 73, 75, 76, 78, 80; 257/222, 257/223, 225, 229, 230
See application file for complete search history.

(56) References Cited

U.S. PATENT DOCUMENTS

| | | | |
|---|---|---|---|
| 5,804,465 A | 9/1998 | Banghart et al. | |
| 5,804,844 A | 9/1998 | Anagnostopoulos | |
| 5,831,298 A * | 11/1998 | Kawamoto et al. | 257/223 |
| 6,369,413 B1 | 4/2002 | Hynecek | |
| 6,559,889 B2 | 5/2003 | Tanaka et al. | |
| 2002/0140003 A1 | 10/2002 | Mizobuchi et al. | |
| 2004/0095491 A1 | 5/2004 | Okada | |
| 2004/0211885 A1 | 10/2004 | Kohno et al. | |
| 2006/0266922 A1 * | 11/2006 | McGrath et al. | 250/208.1 |

OTHER PUBLICATIONS

Edmund K.Banghart, Eric G. Stevens, Hung Q. Doan, Eric J. Meisenzahl, "An LOD With Improved Breakdown Voltage in Full-Frame CCD Devices", Proceedings of SPIE-IS&T, vol. 5678, 2005, pp. 34-47, XP002465033, figure 2; sequences 2, 3.

* cited by examiner

*Primary Examiner*—Kevin M Picardat
(74) *Attorney, Agent, or Firm*—Nancy R. Simon

(57) ABSTRACT

An imaging apparatus includes (a) a full-frame, charge-coupled device having (i) a conductive layer of a first dopant type; (ii) a plurality of pixels arranged as a charge-coupled device in the conductive layer that collects charge in response to incident light and transfers the collected charge; (iii) an overflow drain of a dopant type opposite the first type disposed in the conductive layer and laterally adjacent to each pixel; and the apparatus having (b) a voltage supply connected to the lateral overflow drain that is at a first voltage during readout and at a second voltage that is lower than the first voltage during integration.

8 Claims, 3 Drawing Sheets

METHOD OF IMPROVING SOLID-STATE IMAGE SENSOR SENSITIVITY

CROSS REFERENCE TO RELATED APPLICATIONS

This is a divisional application of U.S. application Ser. No. 11/449,277, filed Jun. 8, 2006 now abandoned.

FIELD OF THE INVENTION

The invention relates generally to the field of full-frame CCD image sensors and, more particularly, to such sensors having lateral overflow drains.

BACKGROUND OF THE INVENTION

Prior art solid-state image sensors that utilize lateral overflow drains (LOD) for blooming control have reduced optical sensitivity due to the depletion region created by the LOD. The LOD depletion region is the area within the device that will extinguish light-generated signals (charge) rather than be collected by the pixel. The reduced collection efficiency results in an apparent loss of sensitivity and is obviously undesired.

Consequently, a need exists for a solid-state image sensor with a LOD that does not adversely affect collection efficiency.

SUMMARY OF THE INVENTION

The present invention is directed to overcoming one or more of the problems set forth above. Briefly summarized, according to one aspect of the present invention, the invention resides in an imaging apparatus comprising (a) a full-frame, charge-coupled device comprising: (i) a conductive layer of a first dopant type; (ii) a plurality of pixels arranged as a charge-coupled device in the conductive layer that collects charge in response to incident light and transfers the collected charge; (iii) an overflow drain of a dopant type opposite the first type disposed in the conductive layer and laterally adjacent to each pixel; and (b) a voltage supply connected to the lateral overflow drain that is at a first voltage during readout and at a second voltage that is lower than the first voltage during integration.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention includes the advantages of increased sensitivity, especially at longer wavelengths.

DETAILED DESCRIPTION OF THE INVENTION

Figure 1:
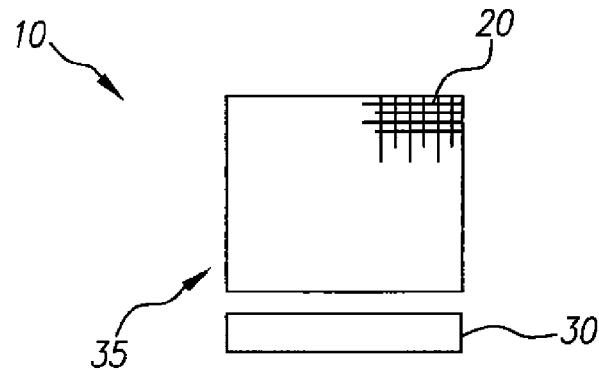
FIG. 1 is a top view of the image sensor of the present invention.

Referring to FIG. 1, there is shown a full-frame type, charge-coupled device (CCD) image sensor 10 of the present invention having a plurality of pixels 20 that are configured as a CCD and form a vertical shift register that passes collected lines of charge to a horizontal shift register 30 for subsequent serial readout to an output amplifier 35.

Figure 2:
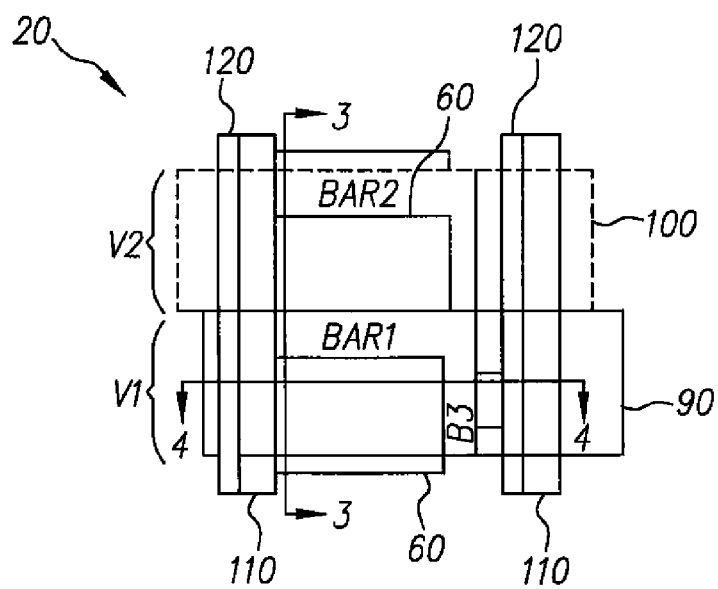
FIG. 2 is a top view of a pixel from the image sensor of FIG. 1.
Figure 3:
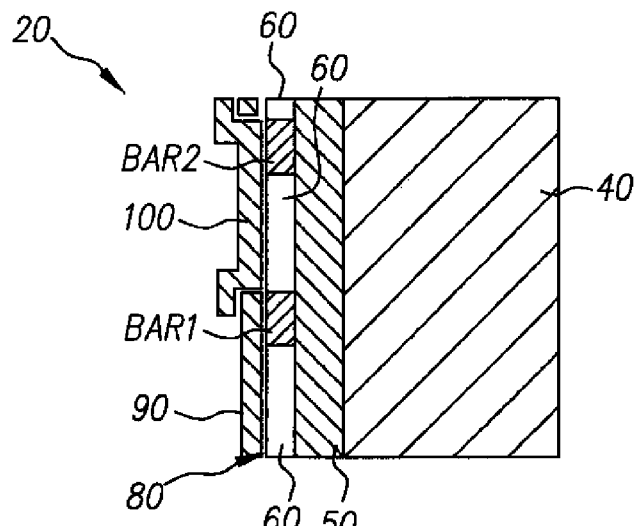
FIG. 3 is a side view of FIG. 2 along line 3-3.
Figure 4:
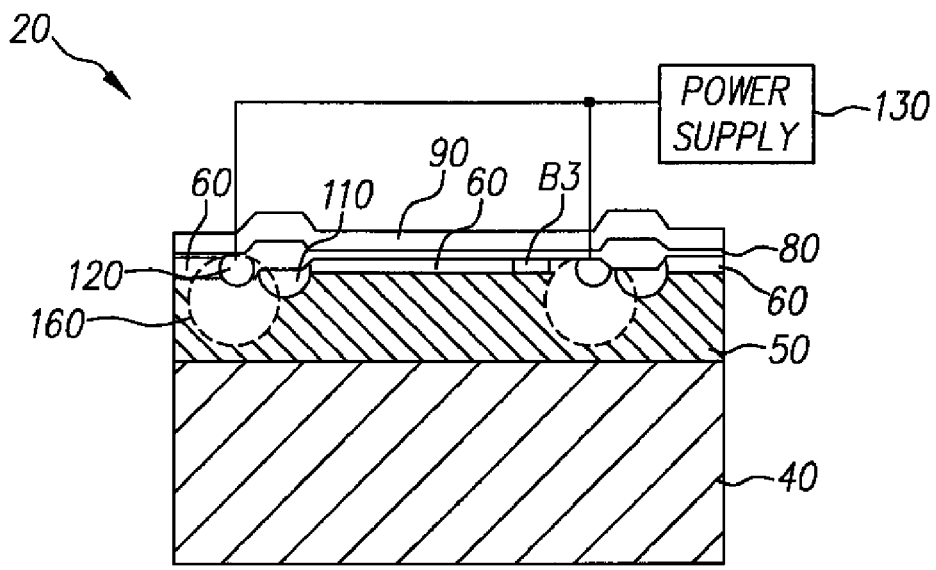
FIG. 4 is another side view of FIG. 2 along line 4-4, and in addition, it also illustrates a connection to the LOD with a power supply.

Referring to FIGS. 2, 3 and 4, there is shown a top view and corresponding side views of a pixel 20 of the image sensor 10 of the present invention. Although there are a plurality of pixels 20, only one full pixel is shown for clarity and simplicity of understanding. The preferred embodiment is shown as a true two phase charge-coupled device (CCD), although other CCD architectures may be used, such as three phase, four phase and the like. The image sensor 10 preferably includes a p-type silicon substrate 40 having a p-type epitaxial layer 50 covering it. Alternatively, an n-type substrate 40 could be used having the p-type layer 50 disposed thereon. Still further, the epitaxial layer 50 could be deleted and the components described herein below as being in the epitaxial layer 50 could be directly in the substrate 40. As used herein, conductive layer means the substrate 40 and epitaxial layer 50, individually or in combination.

A buried channel 60 is formed in the epitaxial layer 50 which is modified by placing two barrier implants BAR1 (which includes area B3) and BAR2. It is noted for clarity that either BAR1 or area B3 are more heavily doped depending on pixel dimensions. An oxide layer 80 is disposed on the surface of the epitaxial layer 50 and two overlapping gate electrodes 90 and 100 are atop the oxide layer 80. The gate electrodes 90 and 100 function to activate the transfer of charge through the buried channels 60. A channel stop 110 is also formed in the epitaxial layer 50 in order to prevent charge from spilling to horizontally adjacent pixels 20. The n-type lateral overflow drain (LOD) 120 is formed within the epitaxial layer 50 adjacent to the channel stop 110 for draining excess charge. It is noted that barrier implants BAR1 and BAR2 function to isolate the pixels 20 vertically. It is to be understood that in order to capture an image, light is passed through the gate electrodes 90 and 100, preferably polysilicon or other suitable transparent materials such as indium-tin-oxide (ITO).

Figure 6:
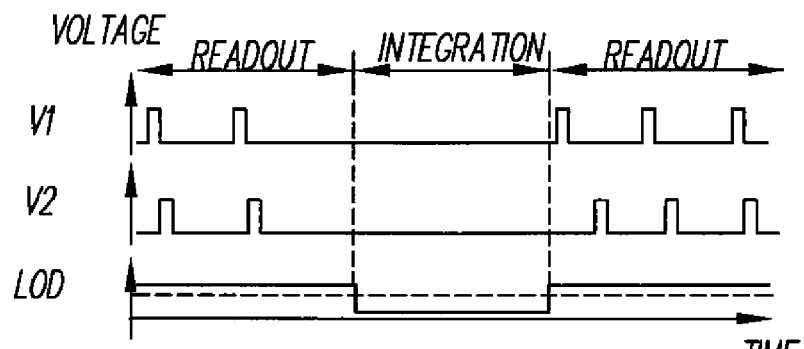
FIG. 6 is a timing diagram for the image sensor of FIG. 1 of the present invention.

Referring to FIG. 6, there is shown a timing diagram for the image sensor of FIGS. 1 and 2. The diagrams are labeled to clearly disclose that there is a readout period and an integration period. For simplicity, the flush period is not shown but is well known to those skilled in the art that this period is before the integration period. Voltages V1 and V2 are applied respectively to gate electrodes 90 and 100. V1 and V2 are held at a constant voltage value during the integration period and are alternately pulsed during readout. The voltage applied to the LOD (as illustrated by the solid line) 120 remains at a first state during the readout period and changes to a lower voltage, second state, during integration. It is noted that the lower voltage is at a voltage substantially close to the substrate voltage, and the substrate voltage is at ground potential. The closer the voltage on the LOD 120 is to ground will result in greater sensitivity improvements. It is to be understood by those skilled in the art that the LOD voltage is always at some level above the substrate voltage in order to prevent charge from injecting from the LOD 120 into the pixel 20 through area B3. Before the V1 and V2 clock voltages transition to a high voltage level (as occurs during readout), the LOD voltage must return to its higher (nominal) voltage level in order to prevent injection from occurring (as described above). This is a result of the fact that injection from the LOD 120 into the pixel 20 is dependent on the voltage level of the V1 clock where higher V1 voltage levels require a higher LOD voltage to prevent injection.

Alternatively, in lieu of clocking the voltage as illustrated by the solid line, the voltage for the LOD 120 may be held at a reduced constant voltage (illustrated by the dashed line). This reduced constant voltage is lower than the prior art image sensor as illustrated in FIG. 5.

Figure 5:
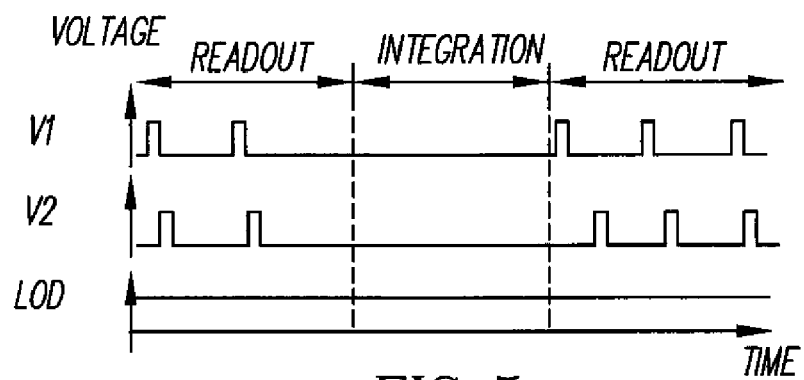
FIG. 5 is a prior art timing diagram.

Referring to FIG. 5, there is shown a typical timing diagram for a prior art CCD. It is noted for purposes of contrast that the voltage for the LOD remains at a constant voltage.

Referring to FIGS. 4 and 6, the application of the LOD voltage (via power supply 130) as described above creates a depletion region 160 (indicated by the dashed lines) in the epitaxial layer 50 surrounding the LOD implant. It is noted that the depletion region is largely dependent on the doping levels of the LOD, the doping levels of the surrounding silicon substrate and the voltage applied to the LOD. FIG. 4 illustrates the depletion region 160 contained within the epitaxial layer 50, but it could also extend into the substrate 40. As understood by those skilled in the art, other features of the pixel that influence the extent of the depletion region include, but are not limited to, dimensions, gate voltages, dopant levels, proximity of structures to one another and the like. This depletion region 160 collects charge which is subsequently removed from the image sensor by the LOD 120 thereby reducing sensitivity. The amount of sensitivity loss is also dependent on the wavelength and incident angle of incoming light. By decreasing the voltage on the LOD 120 during the integration period, the volume of the depletion region 160 decreases and sensitivity is gained, as illustrated by FIG. 7.

Figure 7:
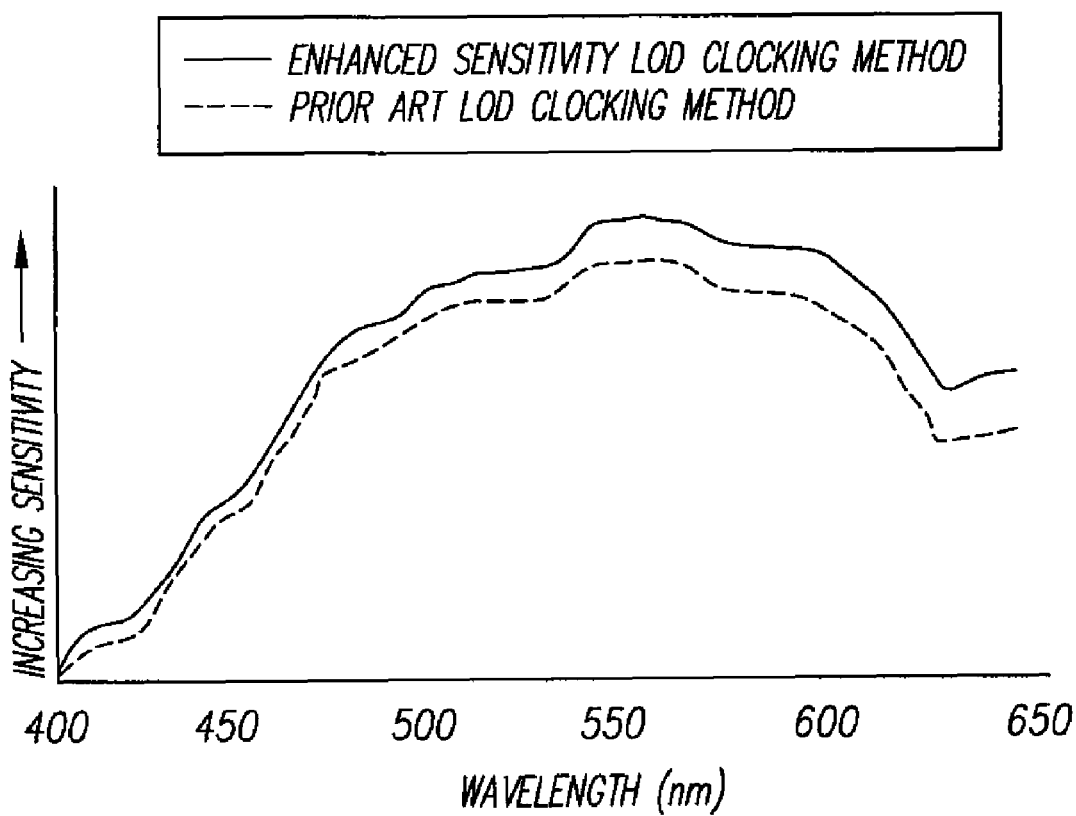
FIG. 7 is a graph illustrating sensitivity versus wavelength for the image sensor of the present invention and a prior art image sensor.

Referring to FIG. 7, there is shown a graph of the sensitivity versus wavelength for the CCD of the present invention and a typical prior art CCD. For the CCD of the present invention there is higher sensitivity. It is noted that as the wavelength increases the sensitivity improvement increases for the COD of the present invention. The reason for the wavelength dependence is that at shorter wavelengths, the charge is created by incident light nearer to the surface of the epitaxial layer 50, for instance, within the buried channel region 60, where the LOD depletion region 160 has little or no influence. At longer wavelengths, charge is created deeper into the silicon epitaxial layer 50 or substrate 40, beyond the buried channel 60, and has a greater probability to be partially collected by the LOD depletion region 160.

Figure 8:
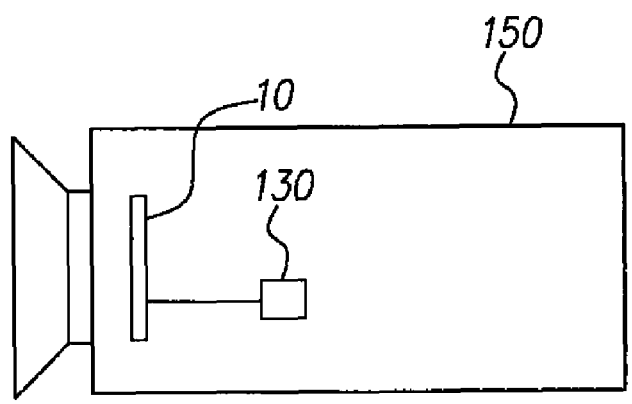
FIG. 8 is a side view of a digital camera in which the image sensor of FIG. 1 and the voltage supply of FIG. 4 are disposed for illustrating a typical commercial embodiment.

Referring to FIG. 8, there is shown an imaging apparatus, preferably a digital camera 150, in which the image sensor 10 of the present invention and the voltage supply 130 of the present invention are disposed for illustrating a typical commercial embodiment to which the ordinary consumer is accustomed.

The invention has been described with reference to a preferred embodiment. However, it will be appreciated that variations and modifications can be effected by a person of ordinary skill in the art without departing from the scope of the invention.

PARTS LIST

10 CCD image sensor
20 pixel
30 horizontal shift register
35 output amplifier
40 p-type silicon substrate
50 p-type epitaxial layer
60 buried channel
80 oxide layer
90 gate electrode V1
100 gate electrode V2
110 channel stop
120 n-type lateral overflow drain (LOD)
130 power/voltage supply
150 image apparatus/digital camera
160 depletion region
BAR1 barrier implant (or area B3)
BAR2 barrier implant
V1 voltage
V2 voltage

The invention claimed is:

1. A method for operating an imaging apparatus comprising:
    (a) providing a conductive layer of a first dopant type;
    (b) providing a plurality of pixels arranged as a charge-coupled device in the conductive layer that collects charge in response to incident light and transfers the collected charge;
    (c) providing an overflow drain of a dopant type opposite the first type disposed in the conductive layer and laterally adjacent to each pixel; and
    (d) supplying a first voltage to the lateral overflow drain during readout and supplying a second voltage that is lower than the first voltage and greater than a voltage of the conductive layer during integration.

2. The method as in claim 1 wherein the first dopant type is p-type.

3. The method as in claim 1 wherein the lower voltage is substantially close to the voltage of the conductive layer.

4. The method as in claim 3 wherein the voltage of the conductive layer comprises a ground potential.

5. The method as in claim 1 wherein the dopant type of the overflow drain is n-type.

6. A method for operating an imaging apparatus that includes a plurality of pixels in a conductive layer and an overflow drain laterally adjacent to each pixel in the conductive layer, wherein the plurality of pixels are arranged as a charge-coupled device that collects and transfers charge, the method comprising:
    (a) during readout, supplying a first voltage to the lateral overflow drain; and
    (b) during integration, supplying a second voltage to the lateral overflow drain that is lower than the first voltage and greater than a voltage of the conductive layer.

7. The method as in claim 6 wherein the first dopant type is p-type.

8. The method as in claim 6 wherein the voltage of the conductive layer comprises a ground potential.

* * * * *